(12) United States Patent
Martinsen et al.

(10) Patent No.: US 9,377,566 B1
(45) Date of Patent: Jun. 28, 2016

(54) FLEXIBLE IRRADIANCE IN LASER IMAGING

(71) Applicant: nLIGHT Photonics, Vancouver, WA (US)

(72) Inventors: Robert J. Martinsen, West Linn, OR (US); Scott R. Karlsen, Battle Ground, WA (US)

(73) Assignee: nLIGHT, Inc., Vancouver, WA (US)

(*) Notice: Subject to any disclaimer, the term of this patent is extended or adjusted under 35 U.S.C. 154(b) by 68 days.

(21) Appl. No.: 14/145,778

(22) Filed: Dec. 31, 2013

Related U.S. Application Data

(60) Provisional application No. 61/747,984, filed on Dec. 31, 2012.

(51) Int. Cl.
*G02B 5/02* (2006.01)
*G02B 5/09* (2006.01)
*G02B 5/00* (2006.01)
*G02B 27/10* (2006.01)

(52) U.S. Cl.
CPC .............. *G02B 5/0273* (2013.01); *G02B 5/00* (2013.01); *G02B 5/02* (2013.01); *G02B 5/09* (2013.01); *G02B 27/10* (2013.01)

(58) Field of Classification Search
CPC ........ G02B 27/10; G02B 5/0273; G02B 5/02; G02B 5/00; G02B 5/09
USPC .................................................. 359/599, 626
See application file for complete search history.

(56) References Cited

U.S. PATENT DOCUMENTS

| | | | |
|---|---|---|---|
| 5,751,750 A | 5/1998 | Friede et al. | |
| 5,757,839 A | 5/1998 | Biswal et al. | |
| 5,998,768 A | 12/1999 | Hunter et al. | |
| 6,124,568 A | 9/2000 | Broderick et al. | |
| 6,256,877 B1 * | 7/2001 | Hacke et al. | 29/832 |
| 6,565,239 B2 | 5/2003 | Rizkin et al. | |
| 6,791,060 B2 | 9/2004 | Dunsky et al. | |
| 7,154,066 B2 * | 12/2006 | Talwar | B23K 26/032 |
| | | | 219/21.65 |
| 7,193,771 B1 | 3/2007 | Smith et al. | |
| 7,413,847 B2 | 8/2008 | Bullington et al. | |
| 7,416,258 B2 | 8/2008 | Reed et al. | |
| 7,593,447 B2 | 9/2009 | Basu | |
| RE43,400 E | 5/2012 | O'Brien et al. | |
| 8,174,674 B2 | 5/2012 | Mulkens et al. | |
| 8,198,566 B2 | 6/2012 | Baird | |
| RE43,605 E | 8/2012 | O'Brien et al. | |
| 8,451,423 B2 | 5/2013 | Janssen et al. | |
| 2006/0000812 A1 | 1/2006 | Weber et al. | |
| 2007/0258149 A1 * | 11/2007 | Gardner et al. | 359/626 |
| 2010/0117009 A1 * | 5/2010 | Moriya et al. | 250/504 R |
| 2012/0160822 A1 | 6/2012 | Pollmann-Retsch et al. | |

* cited by examiner

*Primary Examiner* — Bumsuk Won
*Assistant Examiner* — William R Alexander
(74) *Attorney, Agent, or Firm* — Klarquist Sparkman, LLP

(57) ABSTRACT

An optical processing system for processing an input beam for processing a target, the optical processing system comprising a beam shaping system configured to receive the input beam and to shape the irradiance profile thereof into a beam shaping system output beam, and an optical imaging system configured to receive the beam shaping system output beam and to image the beam shaping system output beam to a target, wherein the imaged beam shaping system output beam provides an irradiance profile configured to produce a predetermined temperature profile associated with the target.

18 Claims, 3 Drawing Sheets

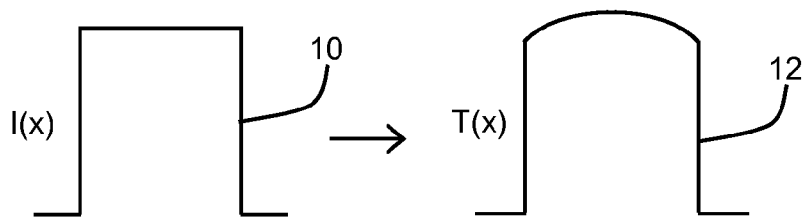
FIG. 1
(Prior Art)
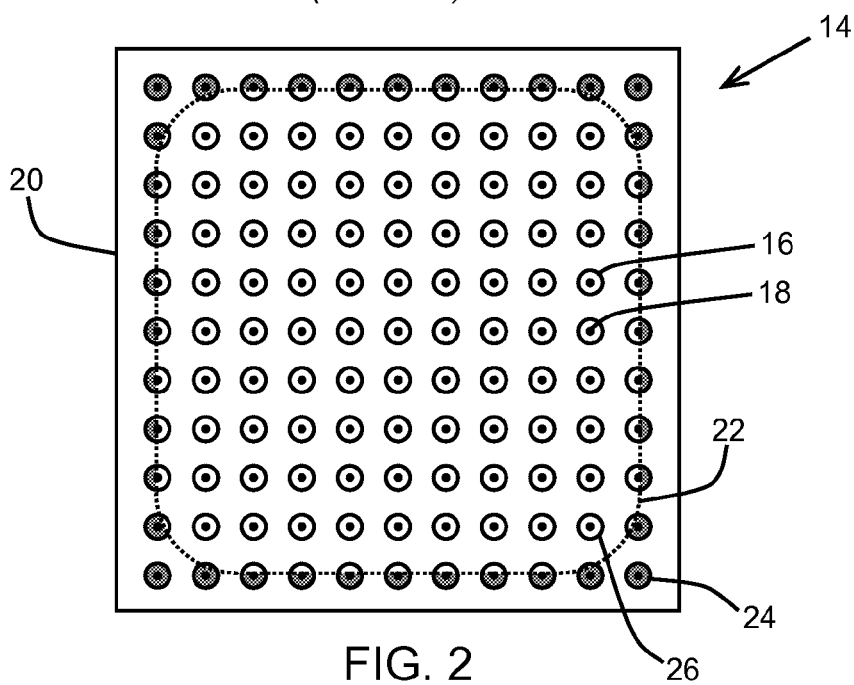
FIG. 2
(Prior Art)
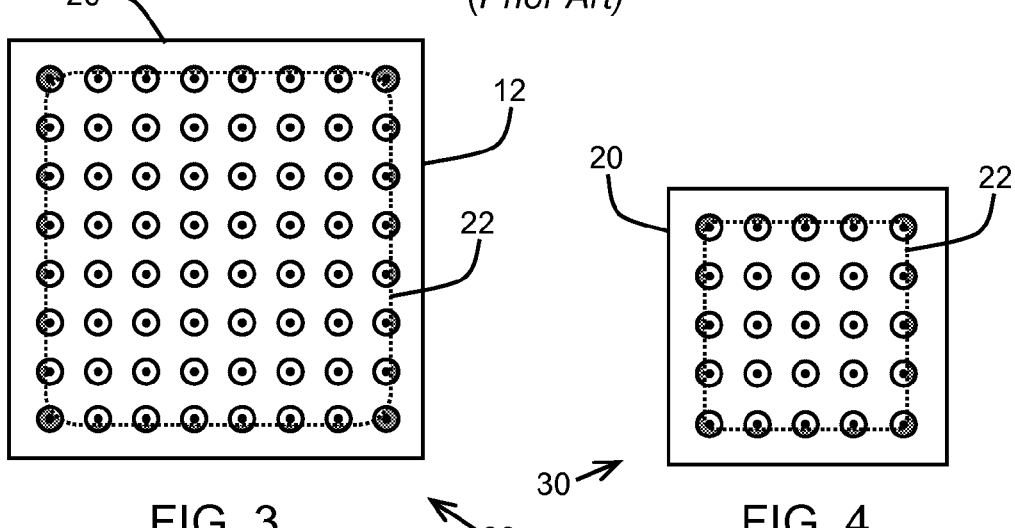
FIG. 3
(Prior Art)
FIG. 4
(Prior Art)

FLEXIBLE IRRADIANCE IN LASER IMAGING

CROSS-REFERENCE TO RELATED APPLICATION

This application claims the benefit of the U.S. provisional patent application 61/747,984 filed Dec. 31, 2012, which is herein incorporated by reference in its entirety.

BACKGROUND OF THE INVENTION

1. Field of the Invention

Generally, the field of the present invention is laser material processing. More particularly, the present invention relates to the uniform heating of a target.

2. Background

Laser systems have enjoyed application to a variety of fields for many years. As transistor and display technologies have advanced over the past few decades, transistor sizes have decreased and LED outputs have increased. Laser systems, and their application to the manufacturing processes of semiconductor materials and electronic devices, have allowed the continued advancement in these areas. Lasers may be used in complex thermal transfer processes, such as laser induced thermal imaging, or may be used more generally to apply predictable heat flux to a variety of target surfaces. For example, laser systems are often important in the manufacture of semiconductor integrated circuit packages where a uniform application of heat is desirable. Also, different integrated circuit packages tend to have different sizes or patterns and corresponding heating characteristics. To provide processing beams for differently sized targets, separate systems or optical elements must be used, adding expense and bulk to the assembly process. Thus, despite the needs in industry for particular heat applications, and for different chip sizes, laser systems have not been developed to accommodate them.

SUMMARY OF THE INVENTION

The present invention is directed to addressing these and other needs, resolving the aforementioned obstacles with an innovation providing high power laser systems with an adaptable or flexible irradiance profile. Thus, an optical processing system for processing an input beam for processing a target is provided, the optical processing system including a beam shaping system configured to receive the input beam and to shape the irradiance profile thereof into a beam shaping system output beam, and an optical imaging system configured to receive the beam shaping system output beam and to image the beam shaping system output beam to a target, wherein the imaged beam shaping system output beam provides an irradiance profile configured to produce a predetermined temperature profile associated with the target.

The foregoing and other objects, features, and advantages will become more apparent from the following detailed description, which proceeds with reference to the accompanying figures.

BRIEF DESCRIPTION OF THE DRAWINGS

FIG. 1 shows prior art chart representations of intensity and temperature profiles.

FIG. 2 is a representative solder ball grid array target with a temperature profile mapped thereon.

FIG. 3 is a representative solder ball grid array target with a temperature profile mapped thereon.

FIG. 4 is a representative solder ball grid array target with a temperature profile mapped thereon.

DETAILED DESCRIPTION OF THE INVENTION

Figure 5:
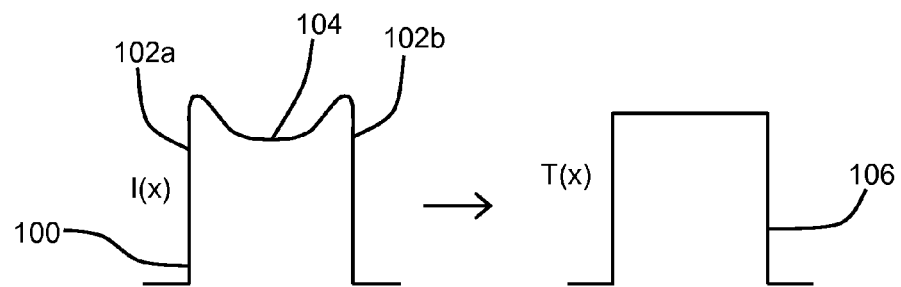
FIG. 5 shows chart representations of intensity and temperature profiles in accordance with an aspect of the present invention.

In FIG. 1 an approximate chart representation is shown of a prior art uniform optical intensity profile 10 across a selected transverse axis of a material processing beam, achievable in some instances for optical material processing systems. Such a uniform profile 10 is useful in many applications, however, as the inventors have uncovered, can actually be non-optimal in some circumstances. Shown to the right of the beam intensity profile 10 is the corresponding temperature profile 12 experienced at the surface (or proximate thereto) targeted by the beam, across the same selected transverse axis as selected for the intensity profile 10. The temperature profile 12 exhibits a non-uniform characteristic even though the intensity of the beam is uniform or substantially uniform. Such a non-uniform characteristic can cause non-uniform heating of the target surface.

Referring now to FIGS. 2-4, examples are shown of targeted surfaces that have been heated non-uniformly using prior art optical processing systems. In FIG. 2, a projection view of the top surface of a target, here a large solder grid array 14, is shown. Actual ball grid arrays may have various configurations, including different pitch, spacing, solder volumes, patterns, etc. For simplicity of illustration the array 14 in FIG. 2 includes an 11×11 array of solder balls 16 each ball 16 encompassing an electrical contact 18. A square processing beam 20 approximately 30 mm on a side and having a uniform transverse intensity profile is incident on the array 14 in order to reheat the solder balls 16 in an electronics manufacturing assembly process. A temperature gradient is shown by temperature contour line 22. Because of the temperature gradient, non-uniform heating occurs causing incorrectly heated solder balls 24 and correctly heated solder balls 26. In further examples shown in FIGS. 3 and 4, a medium sized solder ball grid array 28 and smaller sized sold ball grid array 30 (e.g., 8 mm on a side) are shown with similar results. Moreover, separate arrays 28, 30 must be imaged using separate imaging systems generating beams of suitable shape for the smaller targets.

Referring now to FIG. 5, according to one aspect of the present invention, an irradiance profile 100 is shown that is capable of being generated by optical processing systems of the present invention. The irradiance profile 100 of the processing beam that is incident on a target has a non-uniform characteristic, with more optical intensity nearer the edges 102a, 102b than the center 104 of the profile 100. The corresponding temperature profile 106 associated with the target has a uniform characteristic, which is well-suited for material processing, such as the uniform heating of solder ball grid arrays, by way of example. In different examples, differences in optical intensity between edges 102 or center 104 and an average optical intensity include as little as less than one percent and as great as 50% and sometimes more. For example, in some examples, the edges 102 can have spike-like optical intensity maximums demonstrating a substantial deviation from the optical intensity average of the profile 100. However, in preferred examples, the relative differences between the edges 102 and the center 104 are not as great, and are configured to provide predictable heating profile 106 of the target. Example temperature profiles 106 may also deviate from perfectly uniform, but are generally configured based on the selected optical intensity profile 102 flexibly adapted to the particular size, pattern, and other heating characteristics of the target. For example, targeted integrated circuit chips of different materials and thicknesses may have different thermal diffusion attributes. A configured optical intensity profile 102 can overcome or compensate for these attributes and produce a uniform temperature profile 106 at the chip for proper heating.

Figure 6:
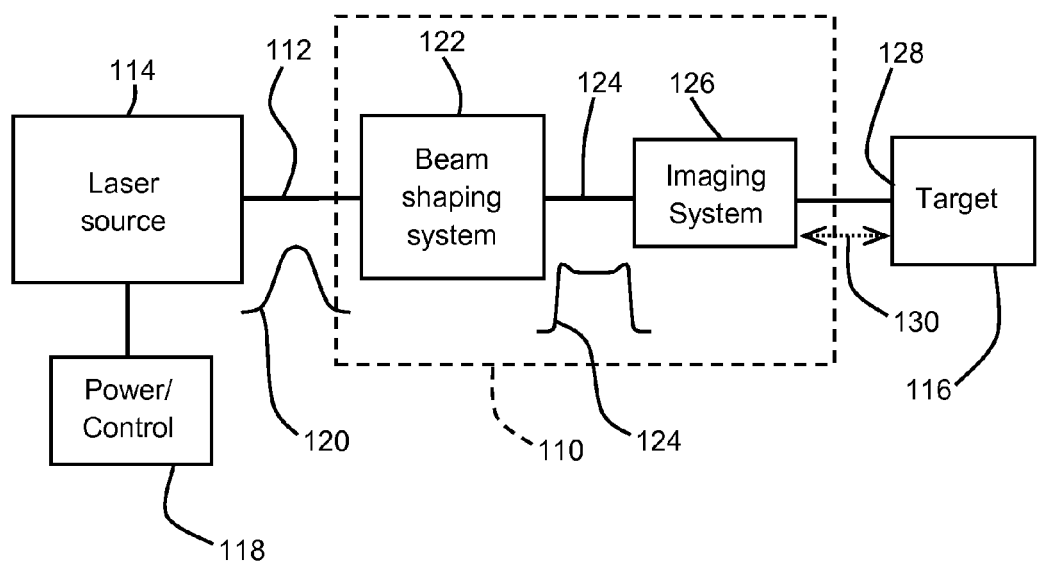
FIG. 6 is a schematic of a laser system in accordance with an aspect of the present invention.

Referring to FIG. 6, an embodiment of an optical processing system 110 is shown in accordance with an aspect of the present invention. The optical processing system 110 is operable to receive an input beam 112, typically from a high powered laser source 114 or other suitable high power optical source and alter or tailor the characteristics of the input beam 112 to match heating requirements of a target 116. Preferably high powered laser source 114 is a fiber-coupled high-power diode laser source operable to emit optical power at a suitable wavelength, such as in the range of 900 nm to 1000 nm, though other wavelengths are possible. One suitable laser source 114 includes a power control 118 providing the capability of varying the power output of the input beam 112. The laser input beam 112 typically has a Gaussian shape 120 in both cross-sectional and angular space and with superior beam quality.

The optical processing system 110 includes a beam shaping system 122 configured to shape the input beam 112 into beam shaping system output beam 124. The beam shaping system output beam 124 can have a desired non-Gaussian profile 126 in angular space adjusted based on the particular requirements of the target or targets 116. The non-Gaussian profile 126 created by the beam shaping system 122 shapes the beam 112 so as to provide more optical intensity at the edges 102 at the target 116. The relative amounts of optical intensity shaping introduced can depend on the particular application requirements. The beam shaping system output beam 124 is received by an optical imaging system 126 which is configured to image the beam 124 into an imaged beam 128 at the target 116. The imaging system 126 can also be configured to provide the imaged beam 128 at different target distances 130, increasing or decreasing the size of the imaged beam 128 for corresponding targets 116 of different size, pattern, or heating requirements, without providing a separate imaging system 110 or laser system. For example, in heating ball grid arrays of different sizes, uniform melting of the targeted solder balls can be achieved by using the optical processing system 110 and corresponding laser systems of the present invention.

Figure 7:
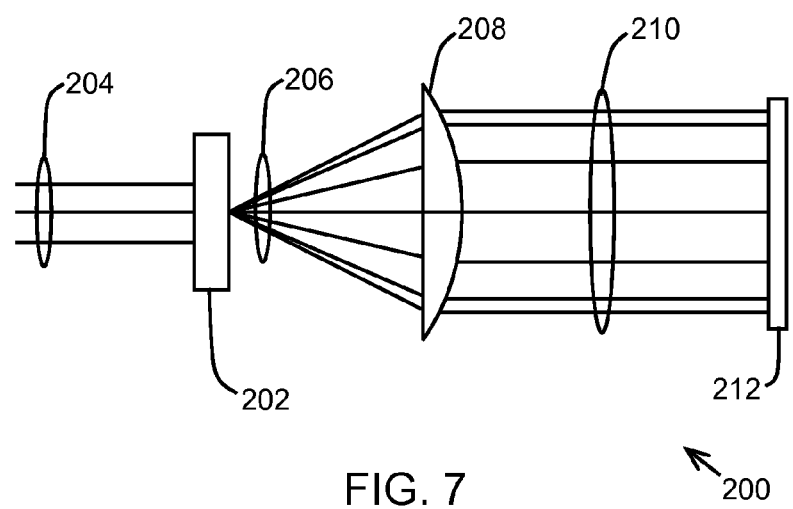
FIG. 7 is a side view schematic of an optical imaging system in accordance with an aspect of the present invention.

Referring now to FIG. 7, a side-view schematic of an optical imaging system 200 is shown. The optical imaging system 200 includes a beam shaping system diffuser 202 transversely positioned with respect to an incident high power laser beam 204. The diffuser 202 is configured to change the divergence profile of the incident beam 204, increasing divergence at larger angles. As depicted after the diffuser 202, the diffuser output beam 206 exhibits a more divergent profile, causing optical intensity to be diverted towards the edge of the beam than to remain in the center. An optical imaging system objective lens 208 is situated to receive the diverging diffuser output beam 206 and to collimate the beam 206 into an imaged beam 210 that is directed to the target 212. In some examples, the imaged beam 210 is divergent in a controlled manner such that the distance between the target and the objective lens can determine a size of the imaged beam 210 at the target 212. Thus, the objective lens 208 converts the divergence profile of the beam shaping system diffuser 202 into an imaged spot with the correct irradiance profile to create uniformity in melting or temperature. Diffusers 202 with lenslets can be designed to have specified divergence profiles. Suitable diffusers 202 include both 1D and 2D diffusers. For example, a 2D diffuser can be situated as shown in FIG. 7, or a pair of transversely situated 1D diffusers may be situated instead. A 2D diffuser 202 provides the selected divergence profile for both transverse axes of the incident beam 204 whereas the pair of 1D diffusers spreads the light in orthogonal axes. In the place of conventional diffusers a fly's eye microlens array diffuser may be used as well.

Figure 8:
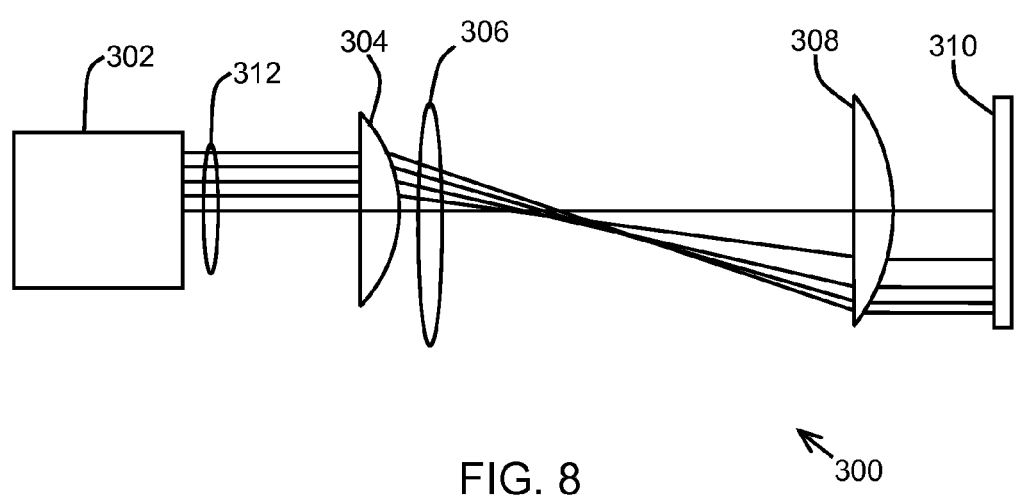
FIG. 8 is a side view schematic of another optical imaging system in accordance with an aspect of the present invention.

Referring now to FIG. 8 an additional example of an optical imaging system, 300, is shown in a side view. The optical imaging system 300 includes a beam shaping system homogenizer 302 and distortion lens 304 providing a divergence adjusted beam shaping system beam 306 to an imaging system objective lens 308. The lens 308 collimates or otherwise directs the divergence adjusted beam 306 to the target 310 for uniform application of heat. The homogenizer 302 typically receives a high power laser beam (not shown) and converts the intensity profile thereof (typically Gaussian) into an input beam 312 to the distortion lens 304 that has a substantially uniform 2D intensity profile. Suitable examples of homogenizer 302 include light pipes, glass rods, or homogenizing optical fibers. The distortion lens 304 can be a single radially symmetric distortion lens or a pair of transversely oriented cylindrical distortion lenses. In some examples lens 304 has a free-form surface that is not necessarily symmetric.

It is thought that the present invention and many of the attendant advantages thereof will be understood from the foregoing description and it will be apparent that various changes may be made in the parts thereof without departing from the spirit and scope of the invention or sacrificing all of its material advantages, the forms hereinbefore described being merely exemplary embodiments thereof.

What is claimed is:

1. An optical processing system for processing an input beam for processing a target, the optical processing system comprising:
   a beam shaping system configured to receive the input beam and to shape the irradiance profile thereof into a beam shaping system output beam, the beam shaping system including a distortion lens and an optical homogenizer, the optical homogenizer situated to provide an input beam with a substantially uniform intensity profile to the distortion lens; and
   an optical imaging system configured to receive the beam shaping system output beam and to image the beam shaping system output beam to a target;
   wherein the imaged beam shaping system output beam provides an irradiance profile configured to produce a predetermined temperature profile associated with the target.

2. An apparatus, comprising:
   a beam shaping system situated to receive a homogenized input beam and to shape the irradiance profile of the homogenized input beam with a diffuser element into a beam shaping system output beam; and
   an optical imaging system situated to receive the beam shaping system output beam and to direct the beam shaping system output beam to a target;
   wherein the beam shaping system output beam has a non-uniform irradiance profile at the target with optical power near the edges being greater than the middle so as to produce a uniform temperature profile associated with the target.

3. The apparatus of claim 2, wherein the diffuser element is a pair of transversely situated 1D diffusers.

4. The apparatus of claim 2, wherein the diffuser element is a fly's eye array diffuser.

5. The optical processing system of claim 1, wherein a distance between the target and the optical imaging system is variable.

6. The optical processing system of claim 1, wherein the optical imaging system includes an objective lens.

7. The optical processing system of claim 1, wherein the distortion lens is radially symmetric.

8. The optical processing system of claim 1, wherein the distortion lens includes a pair transversely situated cylindrical distortion lens elements.

9. The optical processing system of claim 1, further comprising a light source for providing the input beam to the beam shaping system.

10. The optical processing system of claim 1, wherein the imaged beam shaping system output beam has a square shape perpendicular to an axis of propagation.

11. The optical processing system of claim 1, wherein the imaged beam shaping system output beam provides additional optical power nearer the edges so as to provide a uniform temperature at the target.

12. The optical processing system of claim 1, wherein the target is a solder ball grid array and the adaptable irradiance causes a uniform melting thereof.

13. The apparatus of claim 2, wherein the diffuser element is a 2D diffuser.

14. The apparatus of claim 2, wherein the non-uniform irradiance profile is non-uniform along perpendicular axes perpendicular to the direction of the beam shaping system output beam at the target.

15. The apparatus of claim 2, wherein the non-uniform irradiance profile produces a uniform melting of a solder ball grid array target.

16. The apparatus of claim 2, wherein the non-uniform irradiance profile is a variable non-uniform irradiance profile based on the pattern size or pattern shape of the target.

17. The apparatus of claim 2, wherein the non-uniform irradiance profile is variable based on a distance between the target and the optical imaging system.

18. A method, comprising:
   generating from a laser source a laser beam having an irradiance profile;
   homogenizing the irradiance profile of the laser beam with a homogenizer so as to form a homogenized laser beam having a substantially uniform irradiance profile across an axis perpendicular to a propagation axis of the laser beam; and
   receiving the homogenized laser beam and adjusting the uniform irradiance profile so as to form an adjusted homogenized laser beam that has a non-uniform irradiance profile such that optical power near an edge is greater than a middle; and
   directing the adjusted homogenized laser beam to a target so that the target has a uniform temperature profile based on the non-uniform irradiance profile.

* * * * *